United States Patent [19]

Martinez et al.

[11] Patent Number: 5,429,963
[45] Date of Patent: Jul. 4, 1995

[54] TWIN-TUB COMPLEMENTARY HETEROSTRUCTURE FIELD EFFECT TRANSISTOR FAB PROCESS

[75] Inventors: Edgar J. Martinez, Spring Valley, Ohio; Michael Shur, Charlottesville, Va.; Fritz Schuermeyer, Yellow Springs; Charles Cerny, Huber Heights, both of Ohio

[73] Assignee: The United States of America as represented by the Secretary of the Air Force, Washington, D.C.

[21] Appl. No.: 232,978

[22] Filed: Apr. 25, 1994

[51] Int. Cl.⁶ .......................................... H01L 21/331
[52] U.S. Cl. ........................................ 437/40; 437/22; 437/41; 437/34; 437/56; 437/133
[58] Field of Search ..................... 437/40, 22, 29, 34, 437/126, 133, 41, 56, 57; 148/DIG. 72

[56] References Cited

U.S. PATENT DOCUMENTS

| | | | |
|---|---|---|---|
| 4,494,995 | 1/1985 | Tabatabaie-Alavi et al. | 437/22 |
| 4,729,000 | 3/1988 | Abrokwah | 357/22 |
| 4,814,851 | 3/1989 | Abrokwah et al. | 357/42 |
| 4,818,721 | 4/1989 | Wang | 437/22 |
| 4,830,980 | 5/1989 | Hsieh | 437/56 |
| 4,899,201 | 2/1990 | Xu et al. | 357/22 |
| 4,937,474 | 6/1990 | Sitch | 307/448 |
| 5,116,774 | 5/1992 | Huang et al. | 437/29 |
| 5,192,698 | 3/1993 | Schuermeyer et al. | 437/40 |
| 5,192,700 | 3/1993 | Shimura | 437/22 |

*Primary Examiner*—Brian E. Hearn
*Assistant Examiner*—Tuan Nguyen
*Attorney, Agent, or Firm*—Bernard E. Franz; Thomas L. Kundert

[57] ABSTRACT

This is a fabrication process for complementary III-V HFETs in which devices are built side-by-side in doped-areas, known as "tubs", grown by molecular beam epitaxy on indium phosphide (InP) substrates, or other material systems such as materials grown on GaAs substrates. The layers grown are a semi-insulating buffer layer of InAlAs, a InGaAs channel, an InAlAs barrier layer and finally an InGaAs cap layer. All layers are lattice matched or pseudomorphic to the InP substrate. After mesa etching of areas around the transistor, a high temperature silicon nitride ($Si_3N_4$) layer is deposited using chemical vapor deposition, and photoresist is deposited. Then n-well and p-well areas are formed in turn, with appropriate ion-implantation, stripping of the photoresist, and annealing to activate the dopants. Then the $Si_3N_4$ is stripped and the samples thoroughly cleaned. Then, the refractory gate metal is sputtered, delineated with photoresist and reactive ion etch procedures. Areas for n-ohmic and p-ohmic contacts are formed, using with $Si_3N_4$ and photoresist covering, ion implanting, and annealing. Finally the p- and n-ohmic contact metals are evaporated and alloyed. The typical n-ohmic metal system is Au/Ge/Ni while Au/Zn is used for the formation of the p-ohmic contacts. The integrated circuit is completed by depositing and patterning the interconnect metal.

5 Claims, 2 Drawing Sheets

After S/D Ohmic Contact Metalization

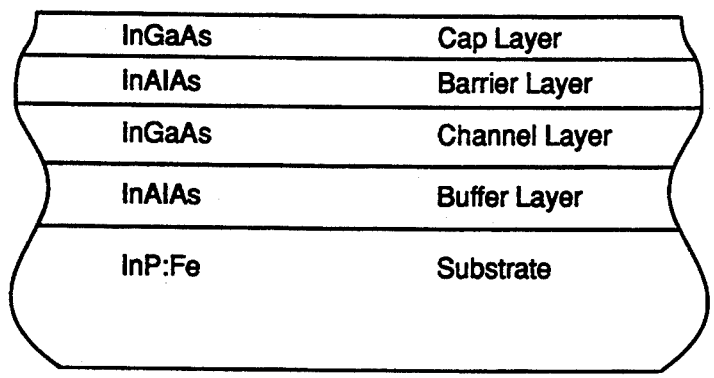
Fig. 1 MBE grown heterostructure
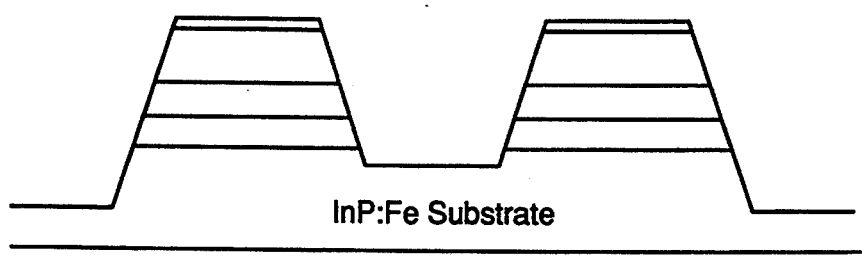
Fig. 2 Structure after mesa etching
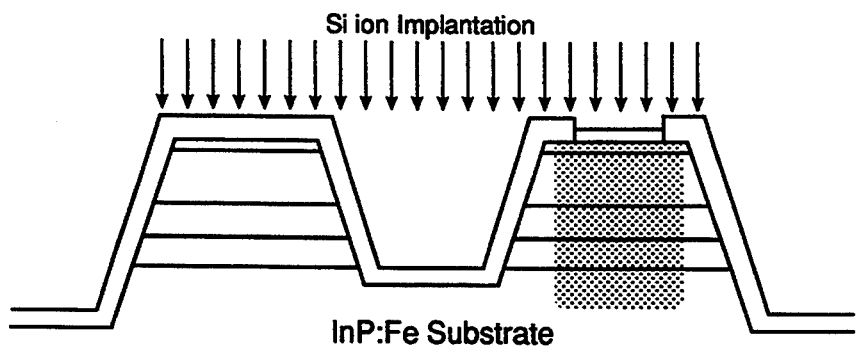
Fig. 3 n-well Implantation
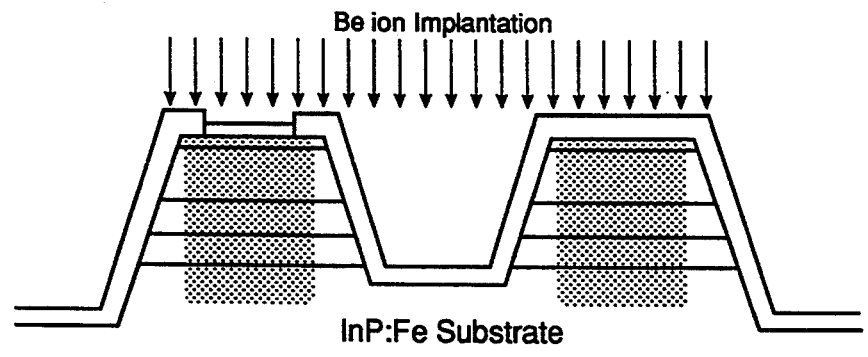
Fig. 4 p-well Implantation

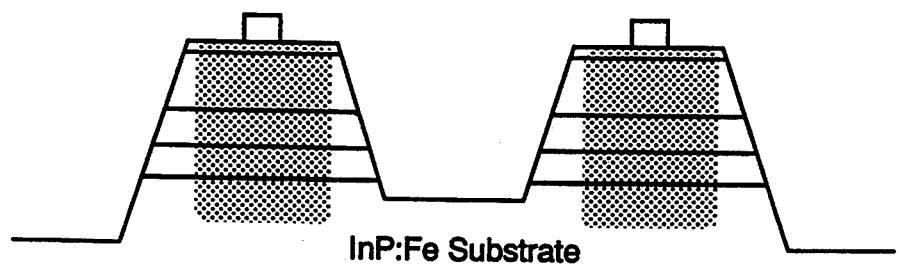
Fig. 5 Gate Process
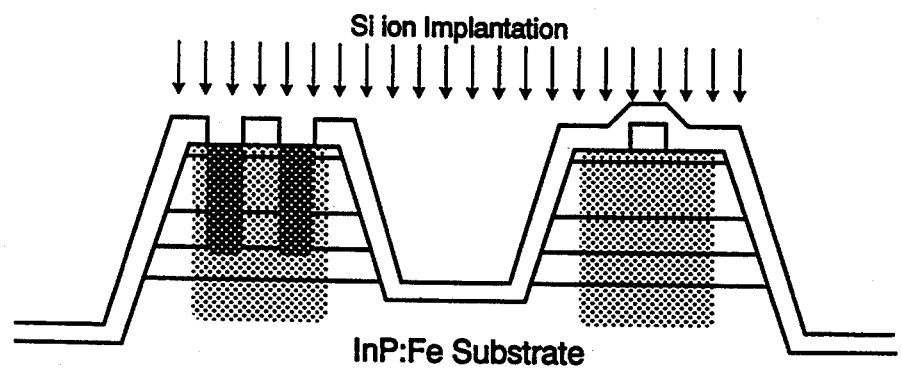
Fig. 6 n-channel Source/Drain Implant
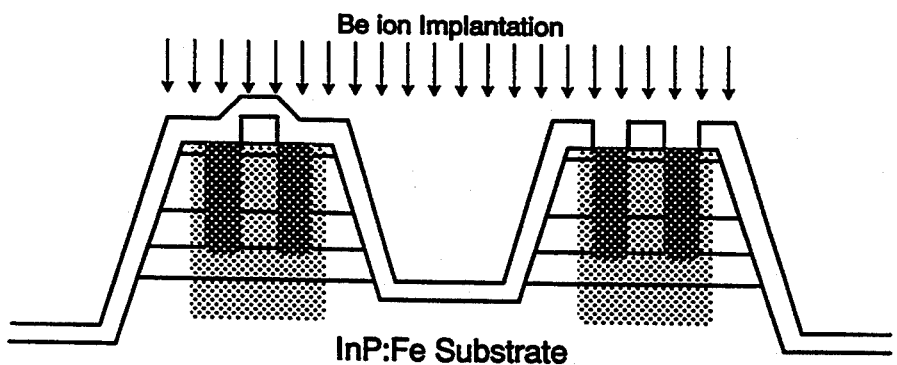
Fig. 7 p-channel Source/Drain Implant
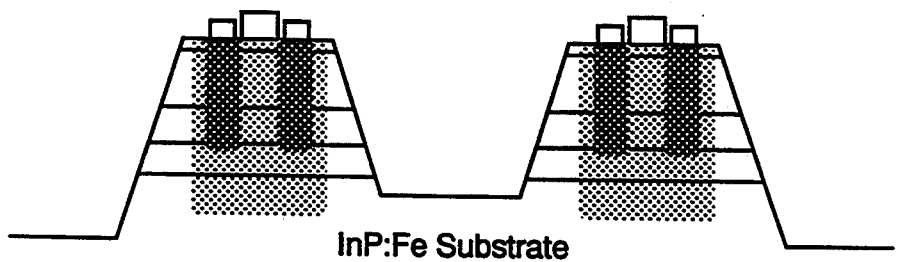
Fig. 8 After S/D Ohmic Contact Metalization

TWIN-TUB COMPLEMENTARY HETEROSTRUCTURE FIELD EFFECT TRANSISTOR FAB PROCESS

RIGHTS OF THE GOVERNMENT

The invention described herein may be manufactured and used by or for the Government of the United States for all governmental purposes without the payment of any royalty.

BACKGROUND OF THE INVENTION

The present invention relates generally to a twin-tub complementary heterostructure field effect transistor (C-HFET) fabrication process, and more particularly to a method of fabricating complementary heterostructures field effect transistors on indium phosphide substrates.

Silicon Metal Oxide Semiconductor Field Effect Transistors (MOSFETs) have been recognized as the workhorse of the modern electronic industry with Complementary MOSFET (CMOS) technology utilized for low power consumption along with high speed applications. To date, the minimum gate size has shrunk to 0.7 microns in commercial IC chips with a commensurate increase in speed and in the integration scale (too many millions of transistors on a single chip for memory ZCs).

According to Shur (M. Shur, Physics of Semiconductor Devices, $1^{st}$ ed., Prentice Hall, N.J. (1990)), the cost of a bit in a computer memory chip has dropped to about $6 \times 10^{-3}$ cents/bit. Sales of MOSFET digital integrated circuits (ICs) in the United State alone have reached six billion dollars per year in the 1980s and are projected to rise; in 1986, the total IC sales in the United State were 11 billion dollars with approximately 7.5 billion dollars dedicated to CMOS ICs. It is expected that IC chips will contain up to 100 million devices per chip by the year 2000, with the cost per bit of memory below $10^{-4}$ cents.

In addition to silicon, new material systems such as GaAs and InP have emerged offering significant advantages over silicon for certain applications. Heterostructures AlGaAs/GaAs, AlGaAs/InGaAs/GaAs, and AlInAs/InGaAs/InP Field Effect Transistors (HFETs), also called Modulation Doped Field Effect Transistors (MODFETs), High Electron Mobility Transistors (HEMTs), Selectively Doped Heterojunction Transistors (SDHTs), and Two-dimensional Electron Gas Field Effect Transistors (TEGFETS), have demonstrated excellent, ultra-high-speed performance.

More recently, complementary n- and p-channel Heterostructure Insulated Gate Field Effect Transistors (HIGFETs) have been developed offering the potential for high-speed, low-power operation. In the CHFET inverter, there is very little current in both stable states, so that the power is consumed only during switching.

Both n- and p-channel devices are fabricated by using self-aligned n+ and p+ implants in the same AlGaAs/GaAs or AlInAs/InGaAs layers. This approach has been pioneered by Honeywell SRC. Other less successful approaches to fabricate Complementary HFETs have been pursued by other companies such as Rockwell Science Center, IBM Research Center, and AT&T Bell Labs, in which the complementary n- and p-devices are fabricated in selectively grown areas in the same substrate (selective regrowth approach), or in which the device materials are stacked on top of each other.

The following United State patents are of interest:

| | |
|---|---|
| 4,937,474 | Sitch |
| 4,899,201 | Xu et al. |
| 4,830,980 | Hsieh |
| 4,814,851 | Abrokwah et al. |
| 4,729,000 | Abrokwah |
| 5,192,968 | Schuermeyer et al. (AF Inv 19569) |

In particular, U.S. Pat. No. 4,729,000 to Abrokwah relates to a low power complementary (Al,Ga) As/GaAs heterostructure insulated gate field effect transistor (HIGFETs) wherein a pseudomorphic InGaAs semiconductor gate is used to reduce the device threshold voltage ($V_T$). This patent further discloses an embodiment wherein silicon was used to create the n+ implanted regions as Mg or Be have each been used to form the p implanted regions. The HIGFET utilizes two epitaxial layers grown on a semi-insulating GaAs wafer. Similar patents have disclosed to Abrokwah et al., U.S. Pat. No. 4,814,851 and to Hsieh, U.S. Pat. No. 4,830,980. The Xu et al, U.S. Pat. No. 4,899,201, relates to improved p-channel FETs and discloses a heterostructure FET formed by a narrow band gap substrate such as GaAs, InGaAs, InP, or SiGe, and a thin wide band gap layer of AlGaAs, InAlAs or Si, dependent upon the particular material used for the substrate. This patent further discloses a HIGFET which can be either a p-channel or an n-channel device depending on whether the source and drain are p+ or n+ conductivity. The Schuermeyer patent, details an approach for the fabrication of staggered complementary circuits on InP substrates. In this invention, the p-channel layer is GaAsSb while the n-channel layer is InGaAs.

SUMMARY OF THE INVENTION

An objective of the invention is to advance the state-of-the-art of III-V Complementary HFET fabrication processes.

As the demand for low-power portable communication systems increases, it is essential that the power consumption in digital integrated components is reduced while the operational speed is increased. The demonstration of state-of-the-art Complementary Heterostructure Field Effect Transistors (C-HFET) fabricated on InP substrates has confirmed the potential of this technology for ultra-high speed VLSI circuits. This next technological generation of devices takes advantage of the speed of the InP-based HFET and the microwatt power of the complementary cell. However, the demand for low power applications is pushing this technology to operate at even lower bias level than the present, meaning devices operating in regions where substrate leakage may affect the device characteristics.

Having this in mind, we are describing a novel fabrication process for complementary HFETs in which devices are built side-by-side in doped-areas, known as "tubs".

This twin-tub fabrication process will improve device characteristics at low gate-bias regions allowing device operation with lower-voltage power supplies. At the same time, this process will be used as a base-line for the design of future innovative approaches to this technology.

A feature of the invention is to detail a twin-tub process for the fabrication of complementary heterostructure field effect transistor circuits on indium phosphide (InP) substrates. The disclosed principles will find applications in other material systems such as materials grown on GaAs substrates.

The device structure is grown by molecular beam epitaxy on a semi-insulating indium phosphide substrate. First a semi-insulating buffer layer of InAlAs, then the InGaAs channel, the InAlAs barrier layer and finally the InGaAs cap layer. All layers are lattice matched or pseudomorphic to the InP substrate.

The device fabrication starts with the mesa etching of the areas around the transistor. Then a high temperature silicon nitride ($Si_3N_4$) layer is deposited using chemical vapor deposition. Photoresist is deposited and the n-well areas are opened. These areas are several times ion-implanted with silicon to obtain a uniform n-type substrate for the p-channel device. The photoresist is stripped and the sample is annealed to activate the n-type dopants. The sample is again covered with photoresist and the p-well areas are opened. The sample is then ion implanted, several times, with beryllium to obtain uniform p-type areas for the n-channel devices. The photoresist is stripped and the samples annealed to activate the p-type dopants. Then the $Si_3N_4$ is stripped and the samples thoroughly cleaned. Then, the refractory gate metal is sputtered, delineated with photoresist and reactive ion etch procedures. Then, the structures are covered with $Si_3N_4$ and photoresist and the area for n-ohmic contacts are opened. These areas are ion implanted with silicon to obtain low resistance n-ohmic contacts. The photoresist is cleaned and the sample is annealed to activate the n-type dopants. The sample is again covered with photoresist and the p-ohmic contact areas are opened. The sample is then ion implanted with beryllium to obtain a high doping density in these areas. The photoresist is stripped and the samples annealed to activate the beryllium ions. Then the $Si_3N_4$ is stripped from the samples. Finally the p- and n-ohmic contact metals are evaporated and alloyed. The typical n-ohmic metal system is Au/Ge/Ni while Au/Zn is used for the formation of the p-ohmic contacts. The integrated circuit is completed by depositing and patterning the interconnect metal.

BRIEF DESCRIPTION OF THE DRAWING

FIG. 1 shows the MBE grown heterostructure;

FIGS. 2-8 show the "twin-tub fabrication process for Complementary Heterostructure Field Effect Transistors.

DETAILED DESCRIPTION

The following is a description of the twin-tub fabrication process for Complementary Heterostructure Field Effect Transistors for complementary circuit applications. FIG. 1 shows the material structure grown by molecular beam epitaxy (MBE). The substrate is semi-insulating indium phosphide (InP). An indium aluminum arsenide (InAlAs) buffer layer of approximately 0.5 micrometer is grown lattice matched to the substrate, followed by a 15-nanometer thick indium gallium arsenide (InGaAs) layer. A 30-nanometer thick InAlAs barrier layer follows. The cap layer is a 5 nanometer thick InGaAs to protect the InAlAs barrier layer during the fabrication process. All layers are lattice matched to the InP substrate.

In FIG. 2, the fabrication process starts with the mesa etching of the transistor areas. This step can be accomplished using a wet chemical etch process.

In FIG. 3, the samples are covered with high temperature silicon nitride followed by photoresist. Then, the photoresist is exposed and removed in the areas where the n-tubs will be located. Silicon is then implanted at various doses and energies to form uniform n-doped areas that will work as substrates for the p-channel devices. After implantation, the photoresist is removed and the implanted dopants are thermally activated.

In FIG. 4, the samples are covered with photoresist. Then, the photoresist is exposed and removed in the areas where the p-tubs will be located. Beryllium is implanted at various doses and energies to form uniform p-doped areas that will work as substrates for the n-channel devices. After implantation, the photoresist is removed and the implanted dopants are thermally activated at the optimum temperature followed by the removal of the silicon nitride layer.

In FIG. 5, the refractory metal, tungsten silicide (WSi) is deposited and delineated with reactive-ion etching.

In FIG. 6, silicon nitride is deposited followed by a photoresist layer. The photoresist is exposed and the areas for the n-ohmic contacts are opened. Then silicon ions are implanted to obtain low resistance n-ohmic contacts. After implantation, the photoresist is removed and the sample is annealed at an optimum temperature to activate the n-typed dopants.

In FIG. 7, a new layer of photoresist is deposited on the silicon nitride. The photoresist is exposed and the areas for the p-ohmic contacts are opened. Then, beryllium ions are implanted to obtain low resistance p-ohmic contacts. After implantation, the photoresist is removed and the sample is annealed at an optimum temperature to activate the p-typed dopants.

Finally, in FIG. 8, the n- and p-ohmic contact metals are evaporated and alloyed. The typical n-ohmic contact metal system is Au/Ge/Ni while Au/Zn is used for formation of the p-ohmic contacts. The integrated circuit is completed by depositing and patterning the interconnect metals.

Alternatives

There exist many variations to this preferred embodiment. Examples are the use of ion implantation for isolating the transistors instead of mesa isolation, and the selection of gate and source/drain metalization.

It is understood, that certain modifications to the invention as described, may be made, as might occur to one with skill in the field of invention, within the scope of the appended claims. Therefore, all embodiments contemplated hereunder, which achieve the objects of the present invention, have not been shown in complete detail. Other embodiments may be developed without departing from the scope of the appended claims.

What is claimed is:

1. A method of fabricating a complementary heterostructure field effect transistor for complementary circuit applications using a twin-tub process for forming n-tubs and p-tubs, comprising the steps:

starting with a semi-insulating III-V material substrate, growing a device structure by molecular beam epitaxy (MBE), comprising first a semi-insulating buffer layer of III-V material, then a channel of a III-V material, then an III-V material barrier layer and finally a III-V material cap layer, all layers being lattice matched or pseudomorphic to the substrate;

starting device fabrication with isolating transistor areas, then depositing a first sacrificial layer using chemical vapor depositing, deposting photoresist and opening n-well areas, ion-implanting these areas to obtain a uniform n-type substrate for the p-channel device, stripping the photoresist and annealing the structure to activate the n-type dopants, again covering the structure with photoresist and opening p-well areas, then ion implanting the structure to obtain uniform p-type areas for n-channel devices, stripping the photoresist and annealing the structure to activate the p-type dopants, then stripping the first sacrificaial layer and thoroughly cleaning the structure, then sputtering refractory gate metal, delineated with photoresist and reactive ion etch procedures, then covering the structures with a second sacrificial layer and photoresist and opening areas for n-ohmic contacts, ion implanting these areas with silicon to obtain low resistance n-ohmic contacts, cleaning the photoresist and annealing the structure to activate the n-type dopants, again covering the structure with photoresist and opening p-ohmic contacts areas, then ion implanting the structure to obtain a high doping density in these areas, stripping the photoresist and annealing the structure to activate the ions, then stripping the second sacrificial layer from the structure, and finally evaporating and alloying p- and n-ohmic contact metal.

2. A method of fabricating an integrated circuit having complementary heterostructure field effect transistors for complementary circuit applications using a twin-tub process for forming n-tubs and p-tubs, comprising the steps:

starting with a semi-insulating indium phosphide substrate, growing a device structure by molecular beam epitaxy (MBE), comprising first a semi-insulating buffer layer of InAlAs, then an InGaAs channel, then an InAlAs barrier layer and finally an InGaAs cap layer, all layers being lattice matched or pseudomorphic to the InP substrate;

starting device fabrication with mesa etching of areas around the transistor, then depositing a first silicon nitride ($Si_3N_4$) layer using chemical vapor deposition, depositing photoresist and opening n-well areas, several times ion-implanting these areas with silicon to obtain a uniform n-type substrate for the p-channel device, stripping the photoresist and annealing the structure to activate the n-type dopants, again covering the structure with photoresist and opening p-well areas, then ion implanting the structure several times, with beryllium to obtain uniform p-type areas for n-channel devices, stripping the photoresist and annealing the structures to activate the p-type dopants, then stripping the first $Si_3N_4$ layer and thoroughly cleaning the structure, then sputtering the refractory gate metal, delineated with photoresist and reactive ion etch procedures, then covering the structures with a second $Si_3N_4$ layer and photoresist and opening the area for n-ohmic contacts, ion implanting these areas with silicon to obtain low resistance n-ohmic contacts, cleaning the photoresist and annealing the structure to activate the n-type dopants, again covering the structure with photoresist and opening p-ohmic contacts areas, then ion implanting the structure with beryllium to obtain a high doping density in these areas, stripping the photoresist and annealing the structure to activate the beryllium ions, then stripping the second $Si_3N_4$ layer from the structure, and finally evaporating and alloying p- and n-ohmic contact metal, the integrated circuit being completed by depositing and patterning interconnected metal.

3. A method according to claim 2, wherein the n-ohmic contact metal is Au/Ge/Ni while Au/Zn is used for the formation of the p-ohmic contacts.

4. A method of fabricating a complementary heterostructure field effect transistor for complementary circuit applications by molecular beam epitaxy (MBE) using a twin-tub process for forming n-tubs and p-tubs, comprising the steps:

(a) growing a material structure by molecular beam epitaxy (MBE) starting with a substrate of semi-insulating indium phosphide (InP) on which an indium aluminum arsenide (InAlAs) buffer layer of approximately 0.5 micrometer is grown lattice matched to the substrate, followed by a 15-nanometer thick indium gallium arsenide (InGaAs) layer, then a 30-nanometer thick InAlAs barrier layer, and a cap layer 5 nanometer thick of InGaAs to protect the InAlAs barrier layer during the fabrication process, all layers being lattice matched to the InP substrate;

(b) starting the fabrication process with mesa etching of transistor areas, using a wet chemical etch process;

(c) covering the structure with silicon nitride followed by photoresist, then exposing the photoresist and removing the photoresist in the areas where n-tubs will be located, silicon being then implanted at various doses and energies to form uniform n-doped areas that will work as substrates for p-channel devices, and after implantation, removing the photoresist and thermally activating the implanted dopants areas;

(d) covering the structure with photoresist, then, exposing the photoresist exposed and removing the photoresist in areas where p-tubs will be located, implanting beryllium at various doses and energies to form uniform p-doped areas that will work as substrates for n-channel devices, then after implantation, removing the photoresist and thermally activating the implanted dopants at an optimum temperature followed by the removal of the silicon nitride layer;

(e) depositing a refractory metal, tungsten silicide (WSi) and delineated it with reactive-ion etching;

(f) depositing silicon nitride followed by a photoresist layer, exposing the photoresist and opening the areas for the n-ohmic contacts, then implanting silicon ions to obtain low resistance n-ohmic contacts, after implantation, removing the photoresist and annealing the structure at an optimum temperature to activate the n-typed dopants;

(g) depositing a new layer of photoresist on the silicon nitride, exposing the photoresist and opening the areas for the p-ohmic contacts, then, implanting beryllium ions to obtain low resistance p-ohmic contacts, after implantation, removing the photoresist and annealing the structure at an optimum temperature to activate the p-typed dopants;

(h) finally evaporating and alloying p- and n-ohmic contact metal, and completing the field effect transistor by depositing and patterning interconnect metals.

5. A method according to claim 4, wherein the n-ohmic contact metal is Au/Ge/Ni and the p-ohmic contact metal Au/Zn.

* * * * *